United States Patent [19]

Enge

[11] Patent Number: 4,745,281
[45] Date of Patent: May 17, 1988

[54] ION BEAM FAST PARALLEL SCANNING HAVING DIPOLE MAGNETIC LENS WITH NONUNIFORM FIELD

[75] Inventor: Harald A. Enge, Winchester, Mass.

[73] Assignee: Eclipse Ion Technology, Inc., Gloucester, Mass.

[21] Appl. No.: 899,966

[22] Filed: Aug. 25, 1986

[51] Int. Cl.$^4$ ............... H01J 3/14; H01J 3/20
[52] U.S. Cl. ............... 250/356 R; 250/396 ML; 250/492.2
[58] Field of Search ........... 250/396 R, 396 M, 492.2, 250/398

[56] References Cited

U.S. PATENT DOCUMENTS

| | | | |
|---|---|---|---|
| 2,777,958 | 1/1957 | LePoole | 250/396 ML |
| 3,122,631 | 2/1964 | Geerk et al. | 250/41.9 |
| 3,689,766 | 9/1972 | Freeman | 250/49.5 T |
| 3,816,748 | 6/1974 | Harrison | 250/296 |
| 4,017,403 | 4/1977 | Freeman | 250/492 A |
| 4,021,675 | 5/1977 | Shifrin | 250/492 A |
| 4,066,895 | 1/1978 | Iwanaga | 250/296 |
| 4,117,339 | 9/1978 | Wolfe | 250/492 A |
| 4,140,913 | 2/1979 | Anger et al. | 250/492 A |
| 4,260,897 | 4/1981 | Bakker et al. | 250/492 A |
| 4,276,477 | 6/1981 | Enge | 250/398 |
| 4,433,247 | 2/1984 | Turner | 250/492.2 |
| 4,447,773 | 5/1984 | Aston | 328/233 |
| 4,476,393 | 10/1984 | Taya et al. | 250/492.2 |
| 4,564,763 | 1/1986 | Bruel et al. | 250/396 ML |
| 4,587,433 | 5/1986 | Farley | 250/492.2 |
| 4,633,138 | 12/1986 | Tokiguchi et al. | 315/111.81 |
| 4,661,712 | 4/1987 | Mobley | 250/492.2 |

FOREIGN PATENT DOCUMENTS 172103 2/1983 Netherlands ............ 250/396 ML

OTHER PUBLICATIONS

IBM Technical Disclosure Bulletin, vol. 19, No. 4, Sep. 1976, "Fine Ion Beam Optical System," J. H. Keller, et al.
The Review of Scientific Instruments, vol. 35, No. 3, 278–287, Mar. 1964, "Effect of Extended Fringing Fields on Ion-Focusing Properties of Deflecting Magnets," by Harold A. Enge.

Primary Examiner—Bruce C. Anderson
Attorney, Agent, or Firm—Lahive & Cockfield

[57] ABSTRACT

An ion source provides ions that pass through an analyzing magnet, image slit, and magnetic quadrupole lenses before entering a beam deflector. The deflected ion beam enters a magnetic field established by a dipole magnetic lens of rectangular cross section in planes parallel to the beam plane including the scanned ion beam, and having a variable width gap in a plane perpendicular to the beam plane that provides a parallel scanned ion beam. The parallel scanned ion beam enters a slot-shaped acceleration column and then scans a target.

11 Claims, 5 Drawing Sheets

ION BEAM FAST PARALLEL SCANNING HAVING DIPOLE MAGNETIC LENS WITH NONUNIFORM FIELD

This invention relates to a magnetic lens which can be used as an alternative to the "constant uniform field magnet of wedge shape" referred to in the patent application Ser. No. 849,786 filed Apr. 9, 1986, of Berrian et al. entitled ION BEAM FAST PARALLEL SCANNING incorporated by reference herein abandoned. In the description of Berrian et al., the wedge magnet was specifically designated to be of a type where the magnetic field was the same everywhere inside the magnet poles. As a consequence of the wedge profile of the poles, the trajectories of ions emanating from a point were deflected so that all the ions emerged from the magnet parallel to one another. In effect, the magnet acted as a lens wherein ions entering at different parts of the magnet had different path lengths in the same magnetic field and consequently were deflected by different angles.

The nature and objects of this invention are set forth in the following detailed description and the accompanying drawings, in which.

Figure 1:
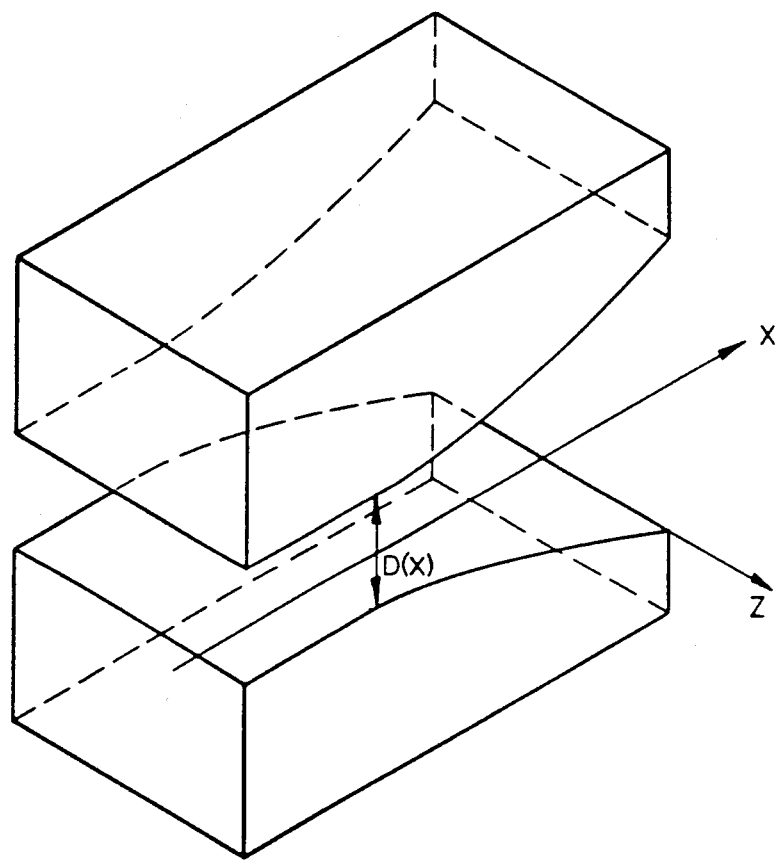
FIG. 1 illustrates a magnet having a pair of poles according to the invention.

The magnet disclosed here also acts as a lens in which ions have deflected by different angles depending on the point of entry, but it differs from the wedge magnet in that ions all have substantially the same path length in the magnetic field region. In this case the different angles of deflection are because the magnetic field is different in different parts of the magnet. The magnet poles are rectangular when viewed from a direction perpendicular to the midplane of the gap, but the gap width D varies with position x along the magnet. The change of D causes a change in the magnetic field B in the gap, such that $B(x) \propto 1/D(x)$. FIG. 1 illustrates the shape of the poles showing the rectangular cross-section and varying gap width.

Assume that the variation with x of the field in the magnet is given by $$B(x) = B_o(1 + ax + bx^2 + \cdots),$$

where $B_o$ is the field at $x=o$ and $a, b, \cdots$ are constants. The values of $B_o$ and the constants can be calculated by a computer program in such a way that ions emanating from a point in front of the magnet emerge from the magnet parallel to one another. The program "Raytrace" calculates the angles of emergence of a number of rays, and the constants $a, b, \cdots$ are then adjusted until the condition of parallelism is met with the required accuracy. The listing of this program is attached as Exhibit A. To achieve the required magnetic field profile, the gap D should be given by:

$$D = D_o(1 + ax + bx^2 + \cdots)^{-1}$$

This variation of D is achieved by machining the appropriate profile on each pole as shown in FIG. 1.

Figure 2:
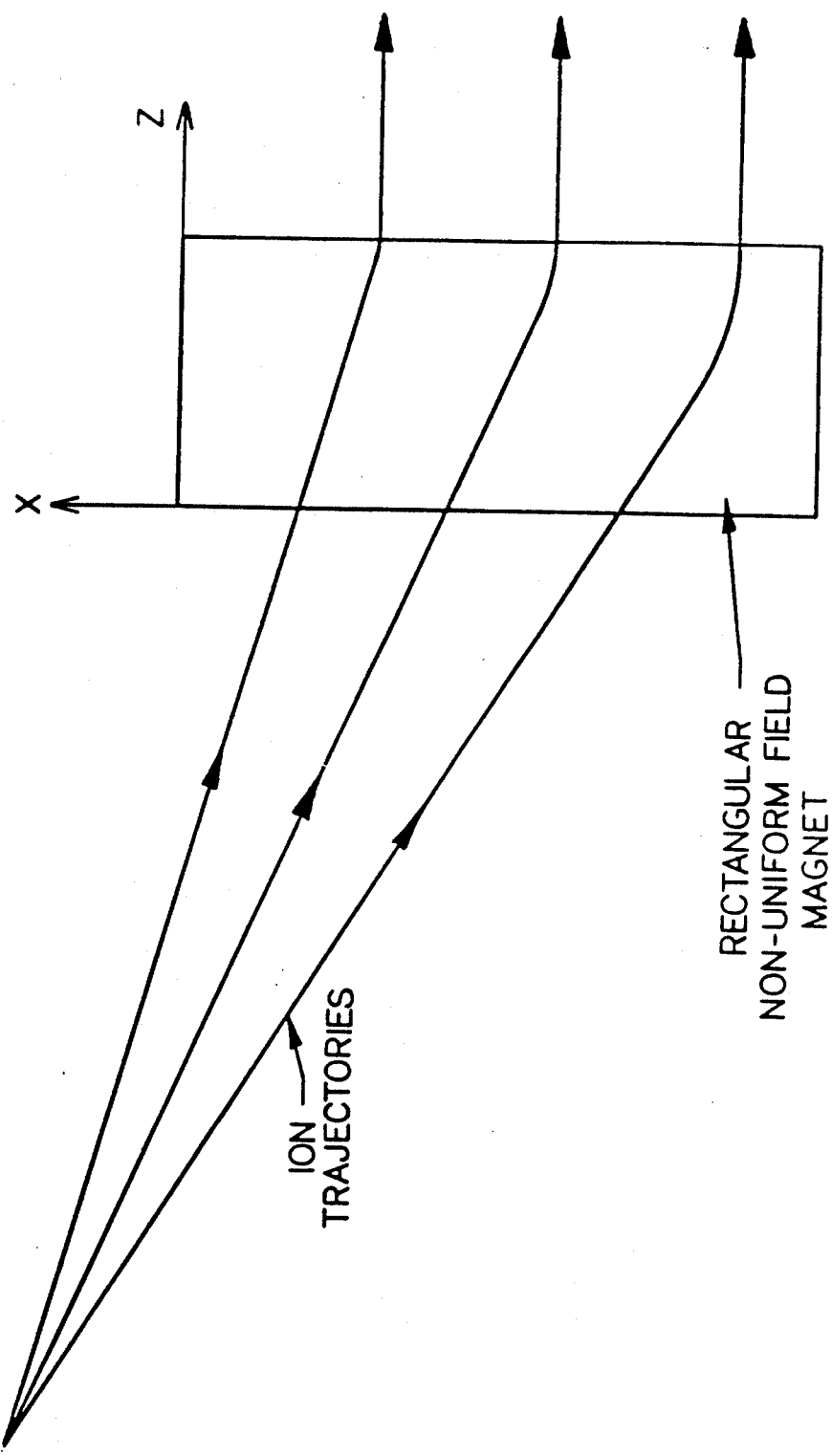
FIG. 2 is a diagram of ion trajectories deflected by a magnet in accordance with one practice of the invention.

FIG. 2 illustrates trajectories of ions emanating from a point and being deflected by a rectangular, nonuniform field magnet so that all trajectories emerge from the magnet parallel to one another.

It is well known (see, for example, H. A. Enge, Rev. Sci. Instrum. 35 1964 278) that the magnetic field between poles with sharp edges extends beyond the physical pole edges. For purposes of calculating the deflection of charged particles, an "effective field boundary" (EFB) can be defined, and in general the distance $\Delta$ from the pole edge to the EFB is proportional to the pole gap D:

$\Delta \approx 0.7 D$ as stated in the above-cited paper.

Figure 3A:
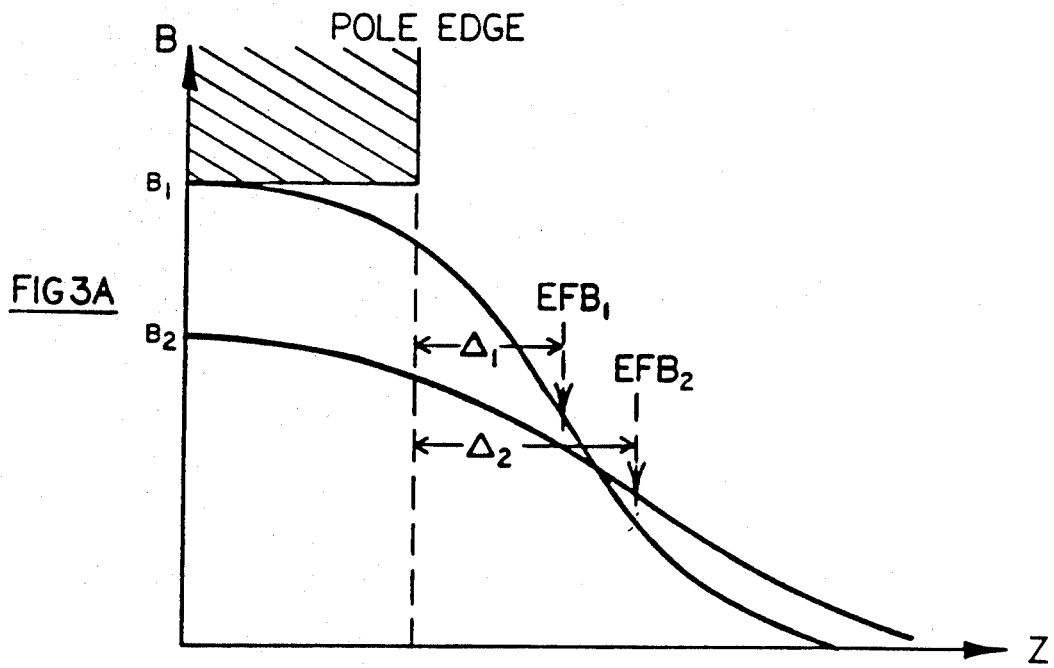
FIGS. 3A and 3B show plots of magnetic field as a function of distance for a magnet having two different gap widths and respectively without and with a field clamp.
Figure 4A:
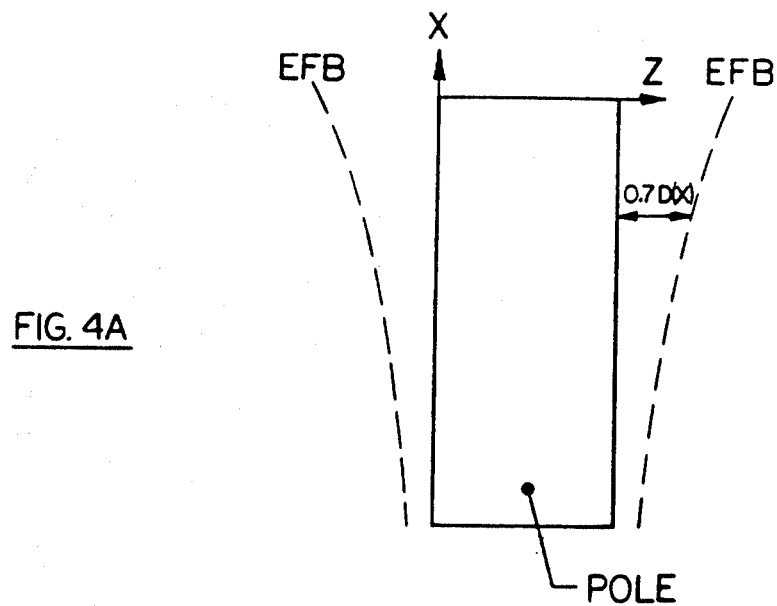
FIGS. 4A and 4B show the locus of the effective field boundary for a magnet according to the invention respectfully without and with a field clamp.

The variation of magnetic field B with distance z from the pole edge, and the location of the EFB for two different values of D, are illustrated in FIG. 3a. FIG. 4a shows the locus of the EFB in the x-z plane for the magnet poles which were illustrated in FIG. 1. The EFB is curved in proportion to the curvature of the pole gap profile, with the extent of the fringing fields being larger where the pole gap is larger. Consequently the path lengths of rays in the fringe fields differ for different parts of the magnet, and it is necessary to take this into account when calculating the values of the constants $a, b, \cdots$ which define the pole profile. The procedure for the calculation is to determine initial values of the constants with EFB curvature neglected, and then to iteratively calculate new values with curvature included, until a self-consistent solution is obtained.

Figure 3B:
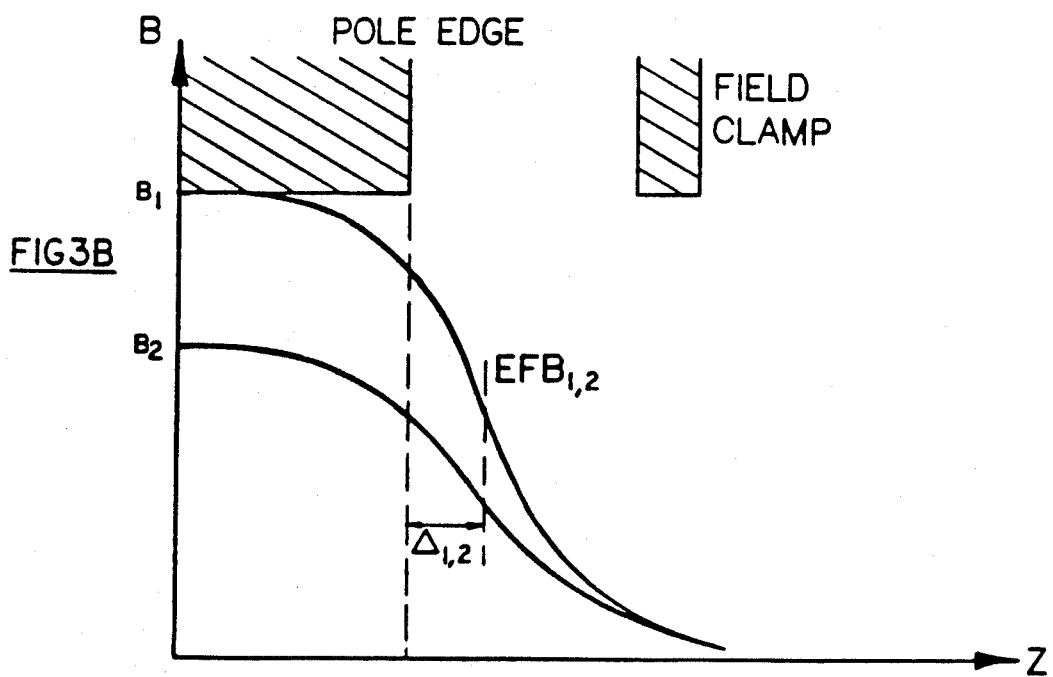
Figure 4B:
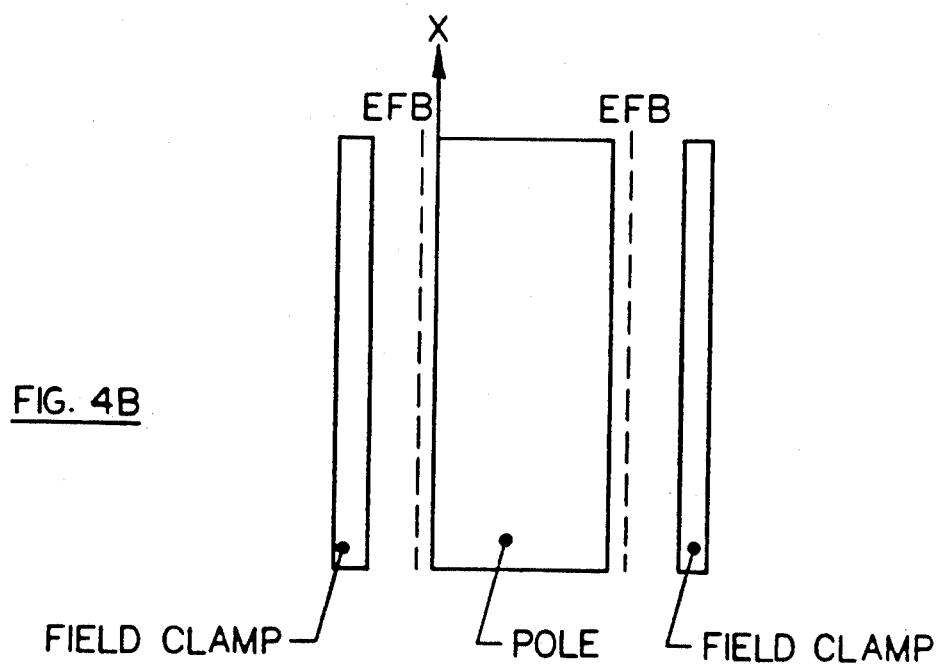

An alternative embodiment of the invention is to manufacture a magnet in which the fringing fields are constrained by means of "field clamps" (also known as "mirror plates") in such a way that the EFB is linear as shown in FIG. 4b. The use of field clamps has been described previously (see the cited paper). The effect of such a clamp is to constrain the field to a very low value inside the gap of the clamp, and consequently to maintain the EFB in a fixed position, independent of the pole gap D or field B (see FIG. 3b). As a result of the use of field clamps, it is possible to calculate the required shape of the poles assuming that the EFB's on either side of the magnet are linear and parallel. This simplifies the calculation and moreover, when the magnet is being manufactured, linearity and parallelism of the EFB's can be ensured by adjusting the shape and location of the field clamps.

Figure 5:
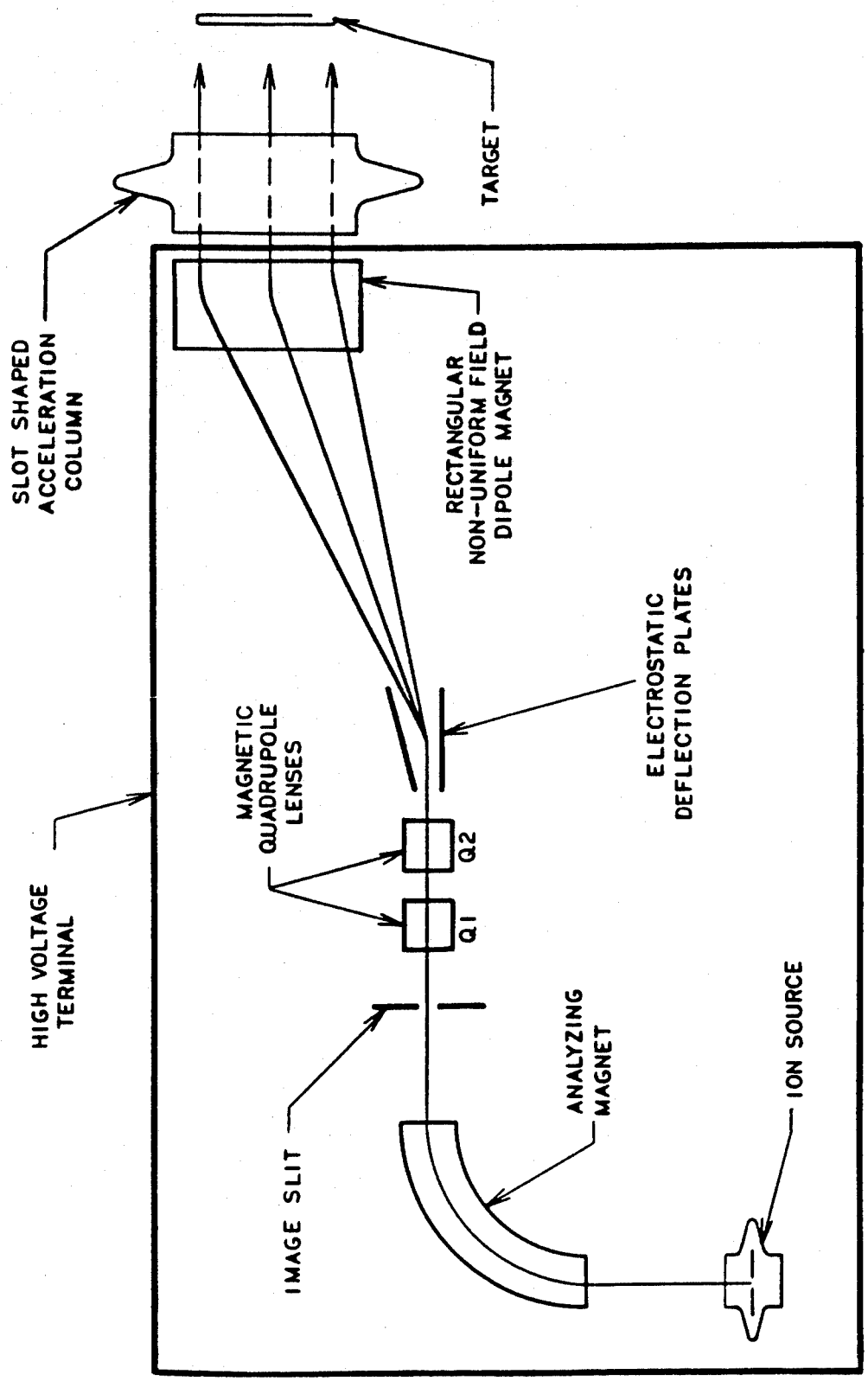
FIG. 5 illustrates an ion beam system in which a magnet embodying the invention is advantageously used.

FIG. 5 shows a complete ion optical system based on use of a rectangular, nonuniform field magnet as described here, together with other magnetic and electrostatic components, all of which are described in the patent application of Berrian et al.

I claim:

1. Apparatus for providing a parallel scanned ion beam, said apparatus comprising
   A. a source of an ion beam,
   B. deflecting means for deflecting said ion beam to provide a deflected ion beam, and
   C. dipole magnetic lens means for establishing a nonuniform magnetic field for deflecting said deflected ion beam to provide a scanned ion beam characterized by a contiguous array of parallel trajectories after emerging from said dipole magnetic lens means, said dipole magnetic lens means comprising a pair of magnetic poles, each of rectangular cross section in planes parallel to a beam plane including the scanned ion beam, and defining between said poles a gap of variable width in a plane perpendicular to the beam plane.

2. In ion beam apparatus for semiconductor apparatus and having (i) an ion beam source, (ii) first deflection means for deflecting the ion beam to a scanning beam having diverging ion trajectories, and (iii) second deflection means for deflecting the scanning diverging ion trajectories to a scanning beam having substantially parallel ion trajectories extending along a first axis and in a plane defined by said first axis and a second axis transverse thereto, the improvement in which said second deflection means comprises A. a pair of magnetic poles having opposed surfaces defining therebetween a gap through which the diverging ion trajectories pass, B. said magnetic poles defining said gap to have a substantially uniform length dimension along said first axis and to have a selected width dimension, between the poles, that varies with position along said second axis, wherein said second axis is transverse to said gap width.

C. whereby said magnetic poles develop in the gap a magnetic field that is substantially uniform along said first axis and that varies selectively along said second axis.

3. In ion beam apparatus according to claim 2, the further improvement wherein each said pole piece has a substantially rectangular shape in the plane defined by said first and second axes.

4. In ion beam apparatus according to claim 3, the further improvement wherein each said pole piece is oriented with one side of said rectangular shape parallel to said first axis and with a further side extending parallel to said second axis.

5. In ion beam apparatus according to claim 2, the further improvement wherein said magnetic poles define said gap to have the uniform gap width at any point along said first axis.

6. A method for producing a scanning ion beam having substantially parallel ion trajectories along a first axis, said method comprising the steps of subjecting a scanning ion beam having diverging ion trajectories to a deflecting magnetic field having substantially uniform path length in the dimension along said first axis and having a value which changes with position along a second axis parallel to the plane of the beam and transverse to said first axis, said subjecting step including providing a pair of magnetic poles having opposed surfaces defining therebetween a gap through which the scanning diverging trajectories pass, and arranging said magnetic poles to have a gap width therebetween as measured perpendicular to said first and second axes which is substantially uniform as measured along said first axis and which varies progressively along said second axis.

7. A method according to claim 6 having the further step of configuring each pole piece to have a substantially rectangular cross section in a plane parallel to said first and second axes and oriented with different sides of the rectangular shape parallel respectively to each of said first and second axis.

8. Apparatus according to claim 1 further comprising means for substantially confining the magnetic field between said pair of poles to be within said gap.

9. Apparatus according to claim 1 further comprising field clamping means for maintaining the effective field boundary of the magnetic field between said pair of poles to have a substantially fixed known position.

10. In ion beam apparatus according to claim 4, the further improvement comprising field clamping means for substantially confining the magnetic field between said pair of magnetic poles to have a substantially known effective field boundary.

11. A method according to claim 6 comprising the further step of substantially confining the magnetic field between said pair of poles to have an effective field boundary at a substantially known position.

* * * * *